United States Patent
Kim et al.

(10) Patent No.: US 10,243,093 B1
(45) Date of Patent: Mar. 26, 2019

(54) ELECTROMAGNETIC SENSOR OF OXYGEN-RICH VANADIUM-OXIDE AND SYSTEM THEREOF

(71) Applicant: ELECTRONICS AND TELECOMMUNICATIONS RESEARCH INSTITUTE, Daejeon (KR)

(72) Inventors: Hyun-Tak Kim, Daejeon (KR); Jin Cheol Cho, Daejeon (KR); Tetiana Slusar, Daejeon (KR)

(73) Assignee: ELECTRONICS AND TELECOMMUNICATIONS RESEARCH INSTITUTE, Dajeon (KR)

( * ) Notice: Subject to any disclaimer, the term of this patent is extended or adjusted under 35 U.S.C. 154(b) by 0 days.

(21) Appl. No.: 16/122,634

(22) Filed: Sep. 5, 2018

(30) Foreign Application Priority Data

Sep. 5, 2017 (KR) .......... 10-2017-0113574
Aug. 17, 2018 (KR) .......... 10-2018-0096337

(51) Int. Cl.
*H01L 31/032* (2006.01)
*H01L 31/18* (2006.01)
(Continued)

(52) U.S. Cl.
CPC .......... *H01L 31/032* (2013.01); *H01L 27/144* (2013.01); *H01L 31/18* (2013.01); *H01L 21/02172* (2013.01)

(58) Field of Classification Search
CPC ...... H01L 31/032; H01L 27/144; H01L 31/18
See application file for complete search history.

(56) References Cited

U.S. PATENT DOCUMENTS 5,801,383 A * 9/1998 Wada .......... G01J 5/20
250/332
7,365,327 B2 4/2008 Baniecki et al.
(Continued)

FOREIGN PATENT DOCUMENTS

EP 1617482 A2 1/2006
KR 10-0308638 B1 4/2002
(Continued)

OTHER PUBLICATIONS

Arash Joushaghani et al., "Wavelength-size hybrid Si-VO2 waveguide electroabsorption optical switches and photodetectors", Optics Express, Feb. 5, 2015, vol. 23, No. 3, Optical Society of America.
(Continued)

*Primary Examiner* — Hugh Maupin (57) ABSTRACT

Electromagnetic sensor of an oxygen-rich vanadium oxide and the system thereof are provided. The electromagnetic sensor of an oxygen-rich vanadium oxide according the embodiment of the present invention comprises; the first substance layer containing silicon doped with an n-type dopant; and the second substance layer arranged on the first substance layer, and containing a vanadium oxide represented by the molecular formula of VxOy. Dopant concentration of the first substance layer can be higher than $1.0 \times 10^{15}$ cm$^{-3}$ and lower than $1.0 \times 10^{19}$ cm$^{-3}$, while the ratio of y to x in the molecular formula can be larger than 2 and smaller than 2.5.

8 Claims, 11 Drawing Sheets

(51) Int. Cl.
*H01L 27/144* (2006.01)
*H01L 21/02* (2006.01)

(56) References Cited

U.S. PATENT DOCUMENTS

| | | | |
|---|---|---|---|
| 8,050,150 | B2 | 11/2011 | Mihara et al. |
| 9,674,470 | B2 | 6/2017 | Kurokawa et al. |
| 2002/0166968 | A1* | 11/2002 | Bradley .................. G01J 5/24 250/338.1 |
| 2005/0141731 | A1 | 6/2005 | Hamalainen |
| 2009/0146058 | A1 | 6/2009 | Ryu et al. |
| 2010/0213472 | A1 | 8/2010 | Yun et al. |
| 2011/0049366 | A1 | 3/2011 | Yang et al. |
| 2012/0061572 | A1* | 3/2012 | Hannebauer ...... H01L 27/14669 250/338.4 |
| 2015/0014538 | A1* | 1/2015 | Holliday ............... G01J 5/0096 250/340 |

FOREIGN PATENT DOCUMENTS

| | | |
|---|---|---|
| KR | 10-2006-0006195 A | 1/2006 |
| KR | 10-2006-0128928 A | 12/2006 |
| KR | 10-0927598 B1 | 11/2009 |
| KR | 10-1290590 B1 | 7/2013 |
| KR | 10-2014-0011251 A | 1/2014 |
| KR | 10-2014-0049917 A | 4/2014 |
| KR | 1020160145040 A | 12/2016 |
| WO | 2004079311 A1 | 9/2004 |

OTHER PUBLICATIONS

Luis G. Gerling et al., "Characterization of Transition Metal Oxide/Silicon Heterojunctions for Solar Cell Applications", Applied Sciences, Oct. 10, 2015, pp. 695-705.

* cited by examiner

ELECTROMAGNETIC SENSOR OF OXYGEN-RICH VANADIUM-OXIDE AND SYSTEM THEREOF

CROSS-REFERENCE TO RELATED APPLICATIONS

This U.S. non-provisional patent application claims priority under 35 U.S.C. § 119 of Korean Patent Application No. 10-2017-0113574, filed on Sep. 5, 2017 and No. 10-2018-0096337, filed on Aug. 17, 2018, the entire contents of which are hereby incorporated by reference.

BACKGROUND

The present invention relates to an electromagnetic sensor of oxygen-rich vanadium oxide and the system thereof, and more specifically, to an electromagnetic sensor of oxygen-rich vanadium oxide comprising the sequentially laminated first and second substance layers and the system thereof.

A device informing through a given signal by sensing changes in external environment energy is called a sensor. Sensors include many types such as temperature sensors, electromagnetic sensors, chemical sensors, magnetic sensors, etc. When external energy is converted to quantum mechanical energy, all the energy can be represented as a function of frequency or wavelength. The energy represented as a function of frequency or wavelength may be classified as an electromagnetic wave.

The electromagnetic sensor is a device that senses light itself or information included in the light by converting the same to an electric signal. Detection objects for the electromagnetic sensor include visible light, ultraviolet ray, and infrared ray. Un-doped silicon has the largest absorption coefficient at a wavelength near the infrared light of 800 nm to 1000 nm. Therefore, an electromagnetic sensor containing silicon has absorption characteristics for an electromagnetic wave in the near infrared region. In particular, absorption peaks of the electromagnetic sensor using silicon as the sensing layer are formed in the near infrared region. Such an electromagnetic sensor has a low absorption coefficient, particularly for the light near the wavelength of 500 nm within the visible light region.

When the near infrared ray comes into contact with a person's skin, cells of human body can be destroyed by a strong heat action due to resonance phenomenon between the infrared ray and the electromagnetic wave inside human body. Accordingly, American Conference of Government Industrial Hygienist (ACGIH) classifies the near infrared ray as an electromagnetic wave harmful to human body. To remove the sensing of light in the near infrared region from a Si sensor, a filter is required. An electromagnetic sensor of a method that removes the sensed wavelength region by using a filter is disadvantageous in manufacturing costs and detection sensitivity. Development is required of an electromagnetic sensor capable of selectively sensing electromagnetic waves in visible light and ultraviolet ray regions by using a new substance and a simple structure.

Meanwhile, there is a motion-sensing sensor made of a pyroelectric material for determining person's presence status. The motion-sensing sensor based on a pyroelectric material senses person's motion by using the principle wherein a small-capacitance capacitor is formed inside based on person's movement. However, the motion-sensing sensors based on pyroelectric material cannot sense a person when electric charge charged in the capacitor is discharged. For continuous recognition by the motion-sensing sensor, there is inconvenience that the person should continue to move. If infrared ray coming out of person's body is sensed, the person needs not move. A sensor is needed for sensing human body's infrared ray capable of recognizing a person even when the person does not move.

In addition, thermistors measuring high temperatures above 150° C. are difficult to manufacture, making them to be expensive. As the device can be made simply by using a thin film-type material, development of such materials has been in need.

SUMMARY

The electromagnetic sensor according to exemplary embodiments to solve the tasks comprises; the first substance layer containing silicon doped with an n-type dopant; and the second substance layer arranged on the first substance layer, and containing a vanadium oxide represented by molecular formula $V_xO_y$; and the first electrode on the second substance layer; and the second electrode on the first substance layer or the second substance layer. Dopant concentration of the first substance layer is higher than $1.0 \times 10^{15}$ $cm^{-3}$ and lower than $1.0 \times 10^{19}$ $cm^{-3}$, while the ratio of y to x in the molecular formula can be larger than 2 and smaller than 2.5.

According to the exemplary embodiments, the second electrode is arranged on the second substance layer, and can be separated from the first electrode.

According to the exemplary embodiments, the first wavelength can have a value between 100 nm and 700 nm, while the second substance layer has the highest absorption coefficient for the electromagnetic wave of the first wavelength.

According to the exemplary embodiments, the first substance layer can have a specific resistance between 1 Ωcm and 10 Ωcm.

According to the exemplary embodiments, a band gap of the vanadium oxide can be 2.30 eV through 2.40 eV.

According to the exemplary embodiments, the ratio of y to x in the molecular formula can be 2.3.

According to the exemplary embodiments, the first substance layer can have a low specific resistance compared with the second substance layer.

According to the exemplary embodiments, the second substance layer can be in direct contact with the first substance layer.

According to the exemplary embodiments, the first substance layer can form a PN junction with the second substance layer.

According to the exemplary embodiments, the second electrode can be arranged on the first substance layer.

According to the exemplary embodiments, the second substance layer can have an absorption coefficient for the electromagnetic wave between 2 μm and 20 μm.

The electromagnetic sensor system according to exemplary embodiments of the present disclosure to solve the tasks comprises; the sequentially laminated first and the second substance layers; and electrodes on the first and the second substance layers; and an amplifier amplifying sensing signals received from the first and the second substance layers by being connected to the electrodes. The first substance layer contains silicon doped with an n-type dopant, and dopant concentration of the first substance layer can be higher than $1.0 \times 10^{15}$ $cm^{-3}$ and lower than $1.0 \times 10^{19}$ $cm^{-3}$, while the ratio of y to x in the molecular formula can be larger than 2 and smaller than 2.5. The second substance layer contains a vanadium oxide represented by the molecular formula of VxOy, while the ratio of y to x in the molecular formula can be larger than 2 and smaller than 2.5.

According to the exemplary embodiments, an analog-digital converter which is converting amplified sensing signals received from the amplifier to digital signals can be included.

According to the exemplary embodiments, the amplifier system can include a Wheatstone bridge circuit measuring resistance values of the first and the second substance layers and a differential amplifier amplifying output voltage of the Wheatstone bridge.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

For sufficient understanding of configuration and effects of the present disclosure, desirable exemplary embodiments are described with reference to the attached drawings. However, the present invention should not be construed as being limited to the exemplary embodiments disclosed below, but can be embodied in various forms with addition of diversified changes. Rather, these exemplary embodiments are provided so that this disclosure will be thorough and complete and will fully convey the concept of the invention to those skilled in the art. Those skilled in the relevant art will understand that the concept of the invention can be implemented under some suitable environments.

The terms used herein is to describe the embodiments and are not intended to Terminology used in the present specification is aimed at description of exemplary embodiments, and not intended to limit the present invention. Unless especially mentioned otherwise in the phrases, singular form shall also include plural form. The words used in the specification such as 'comprises' and/or 'comprising' do not exclude existence or addition of more than one component, step, motion and/or device in or to the mentioned component, step, motion and/or device.

In the specification, when some component is mentioned to be on another component, it means that it may be directly formed on (brought to contact with) another component or a third component may be interposed between them.

Also, for example, when the first film is mentioned to be on the second film, it will be understood that the first film can be formed on the upper face of the second film, on the lower face of the second film or on another surface of the second film. That is to say, the expression of being 'on' shall not be limited to the meaning that some configuration is on 'top' of another configuration. Although the terms such as the first, the second, etc. have been used in diversified exemplary embodiments of the present specification to describe diversified regions, films (layers), etc. these regions and films should not be limited by such terms. These terms have only been used to differentiate some predetermined region or film (or layer) from other region or film (or layer). Each exemplary embodiment described and illustrated herein also comprises complementary example of the same. Parts represented by the same reference number show the same components throughout the specification.

Unless defined otherwise, terms used in exemplary embodiments of the present disclosure may be interpreted in normally known meanings for those skilled in the art.

In the following, the electromagnetic sensor according to embodiments of the present disclosure is explained in detail with reference to the drawings.

Figure 1:
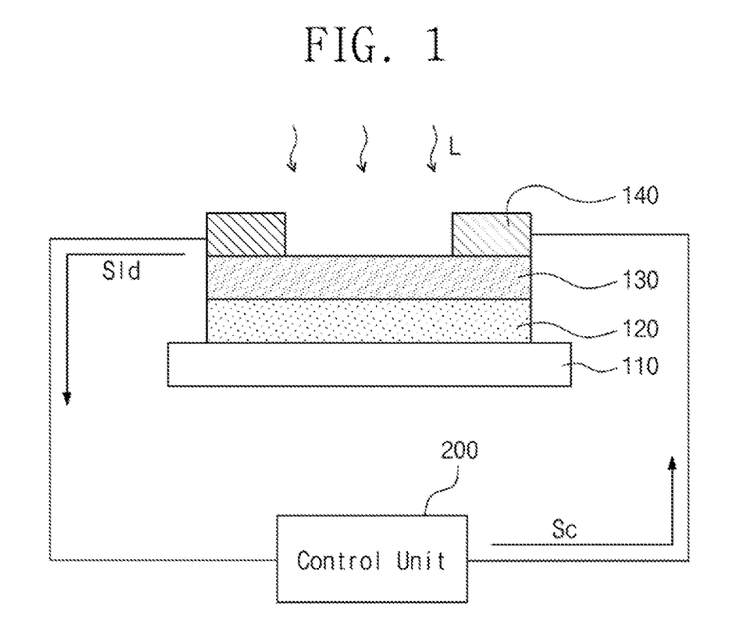
FIG. 1 is a block diagram showing the electromagnetic sensor according to exemplary embodiments of the present disclosure.

FIG. 1 is a block diagram showing the electromagnetic sensor according to embodiments of the present disclosure.

Figure 2:
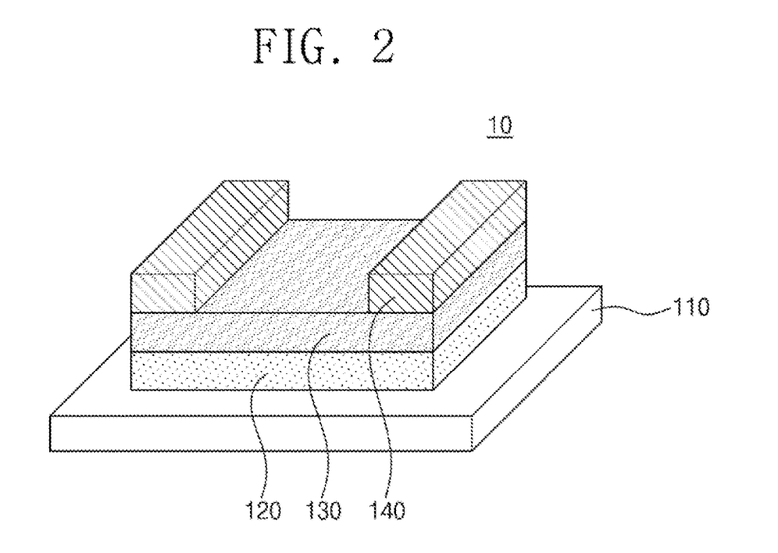
FIG. 2 is a perspective view showing the electromagnetic sensor according to exemplary embodiments of the present disclosure.

FIG. 2 is a perspective view showing the electromagnetic sensor according to embodiments of the present disclosure.

Referring to FIG. 1, the electromagnetic sensor of a vanadium oxide according to embodiments of the present disclosure may comprise the first substance layer (120), and electrodes (140) on the second substance layer (130) on the first substance layer (120) and on the second substance layer (130). The first substance layer (120) and the second substance layer (130) can receive electromagnetic waves (L) from outside of the electromagnetic sensor and output electromagnetic sensing signals (Sld) through the electrodes (140).

According to one example, the control unit (200) can be connected to the electrodes (140). The control unit (200) can apply control signals (Sc) to the second substance layer (130) through the electrodes (140). The control signals (Sc) may contain bias voltage. The first substance layer (120) and the second substance layer (130) can change resistance of the second substance layer (130) in response to electromagnetic waves of the specific wavelength region among electromagnetic waves (L) received from outside. The first substance layer (120) and the second substance layer (130) can output electromagnetic sensing signals (Sld) to the control unit (200) in response to control signals (Sc) and electromagnetic waves in the specific wavelength region. The electromagnetic sensing signals (Sld) may comprise changed amounts of current within the closed circuit formed by the electromagnetic sensor and the control unit (200).

Referring to FIGS. 1 and 2 in detail, the first substance layer (120) can be arranged on the insulating support board (110). The first substance layer (120) may contain a semiconducting substance. The semiconducting substance can be silicon (Si). The first substance layer (120) may be an n-type semiconductor layer doped with a conductive dopant of n-type. When the first substance layer (120) contains silicon (Si), the conductive dopant of n-type can be group V element, for example. The group V element can be phosphor (P) or arsenic (As). The first substance layer (120) can cover a part of the upper face of support board (110). The first substance layer (120) can have a constant thickness from one end to the other end. Thickness of the first substance layer (120) can be 500 nm through fpm, for example.

The first substance layer (120) can interact with the second substance layer (130) so as to allow sensitive reaction of the second substance layer (130) to be described later to electromagnetic waves of the specific wavelength region. As an example, the first substance layer (120) can provide the second substance layer (130) with carriers (holes or electrons, for example). As another example, the first substance layer (120) can form a PN junction with the second substance layer (130). Concentration of n-type dopant in the first substance layer (120) can be higher than $1.0 \times 10^{15}$ cm$^{-3}$ and lower than $1.0 \times 10^{19}$ cm$^{-3}$. When the concentration of n-type dopant in the first substance layer (120) is higher than $1.0 \times 10^{19}$ cm-3, the first substance layer (120) functions as a conductor, and resistance change in the second substance layer (130) may not be sensed. When the concentration of n-type dopant in the first substance layer (120) is lower than $1.0 \times 10^{15}$ cm$^{-3}$, electrons within the first substance layer (120) may not function as the majority carrier. Namely, when the concentration of n-type dopant in the first substance layer (120) is lower than $1.0 \times 10^{15}$ cm$^{-3}$, the first substance layer (120) may not help reaction of the second substance layer (130) to the electromagnetic waves of a specific wavelength band. The effects described above are described more specifically below by referring to Table 1 and exemplary experiments.

Further, the first substance layer (120) can have reactivity to electromagnetic waves in visible light region lowered by having n-type conduction, and a dopant concentration that is higher than $1.0 \times 10^{15}$ cm$^{-3}$ and lower than $1.0 \times 10^{19}$ cm$^{-3}$. Thus, inclusion of noise in the electromagnetic sensing signals (Sld) due to unnecessary absorption of electromagnetic waves by the first substance layer (120) can be prevented. When the first substance layer (120) contains silicon (Si), the first substance layer (120) having the concentration of n-type dopant (in excess of $1.0 \times 10^{15}$ cm$^{-3}$ and less than $1.0 \times 10^{19}$ cm$^{-3}$) can have a specific resistance of 1 Ωcm through 10 Ωcm. The first substance layer (120) can have a lower specific resistance compared with the second substance layer (130). The first substance layer (120) having a specific resistance of 1 Ωcm through 10 Ωcm can improve reactivity of the second substance layer (130) to the electromagnetic waves in the specific wavelength region while not obstructing measurement of resistance changes in the second substance layer (130). According to the exemplary embodiments, formation of the first substance layer (120) may comprise implementation of ion implant process on a silicon layer and rapid thermal processing.

The second substance layer (130) may be arranged on the first substance layer (120). The second substance layer (130) can completely cover the upper face of the first substance layer (120). Also, the second substance layer (130) can make direct contact with the first substance layer (120). Thickness of the second substance layer (130) can be constant from the one end to the other end. For example, the thickness of the second substance layer (130) can be 500 nm through him. According to one example, the second substance layer (130) can be arranged directly on the first substance layer (120). The second substance layer (130) can contain a vanadium oxide represented by the molecular formula of VxOy. In the molecular formula, the ratio of y to x can be larger than 2 and smaller than 2.5. In other words, atomic ratio of oxygen (O) to vanadium (V) within the vanadium oxide can be larger than 2 and smaller than 2.5. The ratio between atomic percent of vanadium and atomic percent of oxygen within the second substance layer (130) can be constant from the upper face of the second substance layer (130) to the lower face of the second substance layer (130) (See FIG. 3). The vanadium oxide can have a bandgap of 2.30 eV through 2.40 eV. The second substance layer (130) can selectively absorb light of visible light region and ultraviolet ray region, and can reflect or transmit most of the light in infrared ray region. According to the exemplary embodiments, the electromagnetic sensor can further comprise a filter to absorb electromagnetic waves of a specific wavelength region.

According to the exemplary embodiments, formation of the second substance layer (130) may comprise growth of vanadium oxide by implementation of vapor deposition on the first substance layer (120). The deposition process can include pulse laser deposition (PLD), sputtering, sol-gel method and atomic layer deposition (ALD). The second substance layer (130) can be formed in an oxygen-rich atmosphere. For example, when the second substance layer (130) is formed by using the atomic layer deposition method, the time required for surface saturation reaction by using an oxygen precursor can be longer compared with the time for surface saturation adsorption of vanadium. According to the exemplary embodiments, formation of the second substance layer (130) may further comprise annealing of vanadium oxide in an oxygen atmosphere after growth of the vanadium oxide on the first substance layer (120).

Electrodes (140) can be arranged on the first and the second substance layers (120, 130). Electromagnetic sensor (10) can be a 2-terminal device having two mutually separated electrodes (140). Specifically, as shown in FIG. 2, the electrodes (140) can be arranged on the second substance layer (130) in mutual separation. Each of the electrodes (140) can be arranged at the one end and at the other end facing one end of the second substance layer (130). For example, each of the electrodes (140) can have a form of a rod traversing the upper face of the second substance layer. For example, the electrodes (140) can include aluminum (Al) or copper (Cu).

Figure 3:
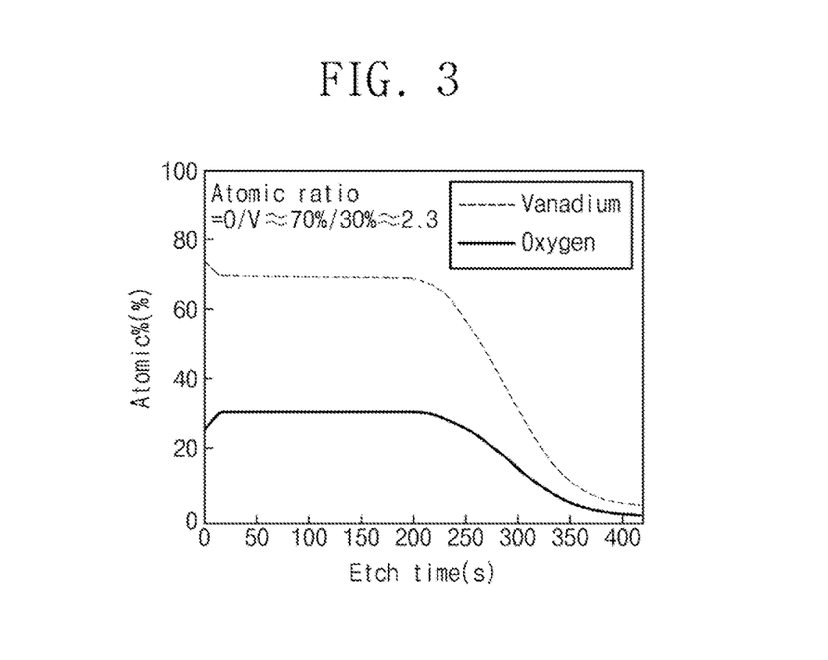
FIG. 3 is a graph showing measurements of atomic percent of vanadium and oxygen for a vanadium oxide thin film according to exemplary embodiments of the present disclosure.
Figure 4:
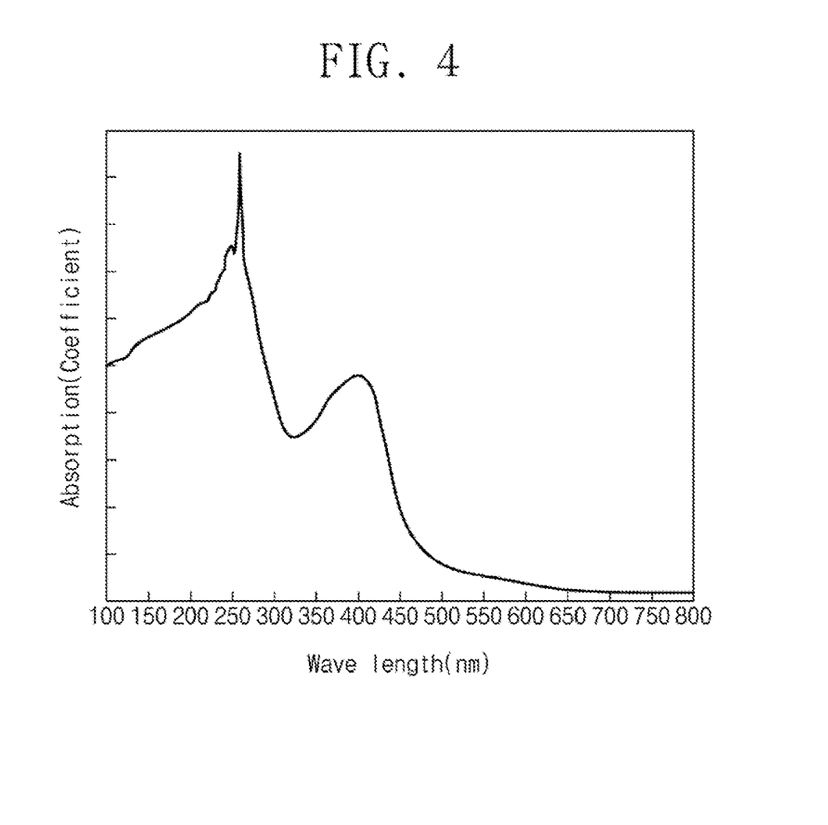
FIG. 4 is a graph showing measurements of absorption coefficient as a function of wavelength for a vanadium oxide thin film according to embodiment examples of the present disclosure.
Figure 5:
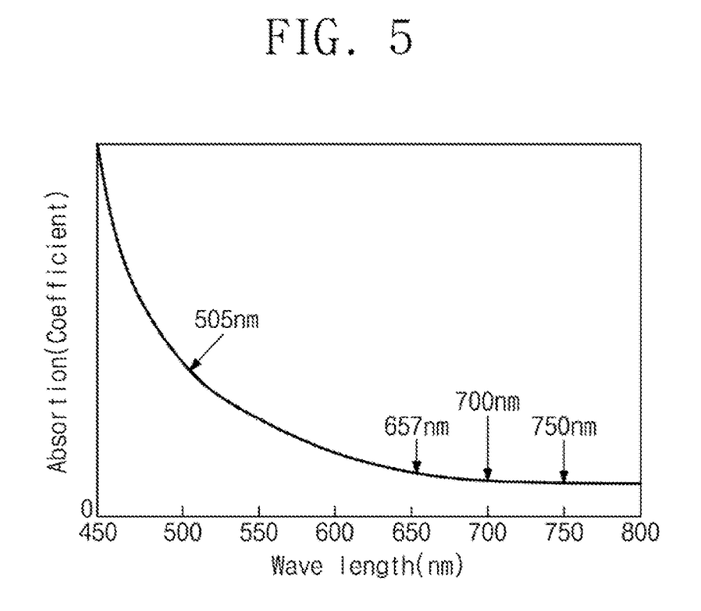
FIG. 5 is a graph expanding the wavelength region of 450 nm through 800 nm in the graph of FIG. 4.
Figure 6:
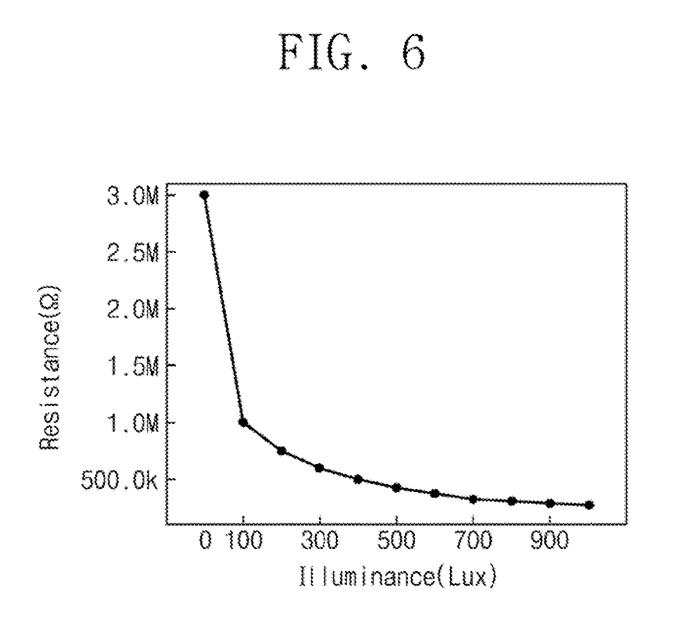
FIG. 6 is a graph showing electromagnetic sensing characteristics of the electromagnetic sensor as a function of illuminance according to exemplary embodiments of the present disclosure.
Figure 7:
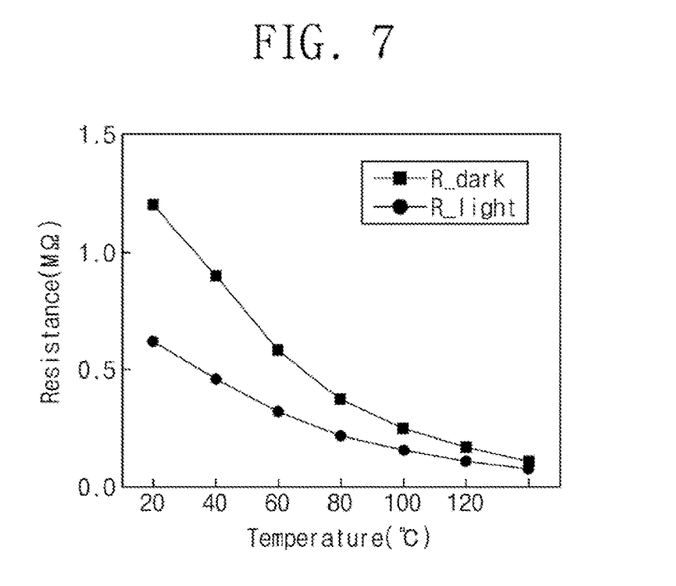
FIG. 7 is a graph showing temperature-dependence of sensitivity of the electromagnetic sensor according to exemplary embodiments of the present disclosure.
Figure 8:
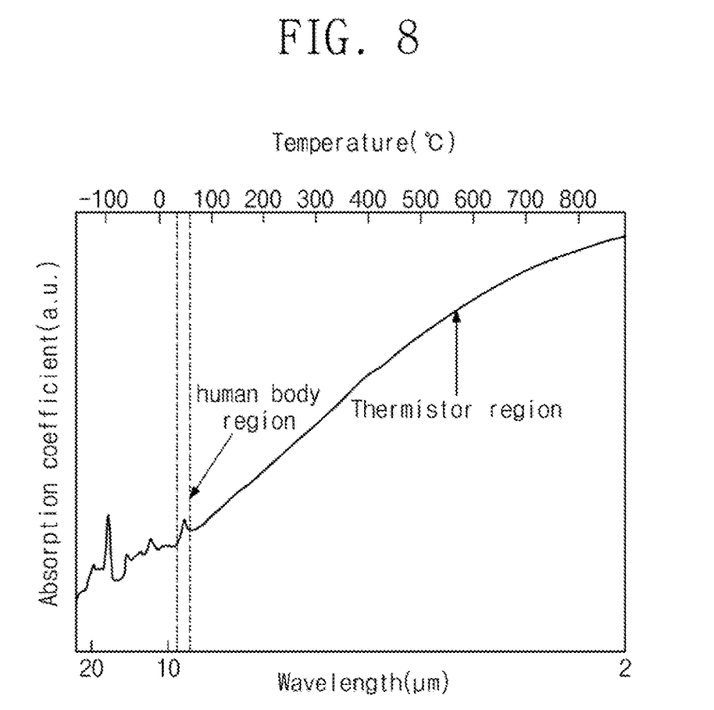
FIG. 8 is a graph showing absorption spectrum when exposed to thermal infrared ray according to exemplary embodiments of the present disclosure.

FIG. 3 is a graph showing measurements of atomic percent of vanadium and oxygen for a vanadium oxide thin film according to exemplary embodiments of the present disclosure. FIG. 4 is a graph showing measurements of absorption coefficients as a function of wavelength for the vanadium oxide thin film according to embodiments of the present disclosure. FIG. 5 is a graph of expanding the wavelength region of 450 nm through 800 nm in the graph of FIG. 4. FIG. 6 is a graph showing electromagnetic sensing characteristics of the electromagnetic sensor as a function of illuminance according to exemplary embodiments of the present disclosure. FIG. 7 is a graph showing temperature-dependence of the electromagnetic sensor's sensitivity according to exemplary embodiments of the present disclosure. FIG. 8 is a graph showing an absorption spectrum of the electromagnetic sensor when exposed to thermal infrared ray according to exemplary embodiments of the present disclosure.

Experimental Example 1

By the deposition of a preliminary vanadium oxide film on a board followed by annealing of the vapor-deposited vanadium oxide thin film in an oxygen atmosphere for a predetermined time, a vanadium oxide thin film was formed with oxygen atomic percent controlled.

While the vanadium oxide thin film is being etched, atomic percent of vanadium and oxygen within the vanadium oxide thin film was measured by using X-ray photoelectron spectroscopy (XPS). Measured results are shown in FIG. 3.

In the graph of FIG. 3, excluding the section where errors can occur in measurement of binding energy due to scattering by carbon, the ratio of y to x for vanadium oxide (VxOy) can be seen to be larger than 2 and smaller than 2.5.

Experimental Example 2

A vanadium oxide thin film was formed under the same conditions as with Exemplary experiment 1. Namely, the vanadium oxide thin film used for Exemplary experiment 2 comprises the vanadium oxide represented by the molecular formula of VxOy, wherein the ratio of y to x in the molecular formula is larger than 2 and smaller than 2.5.

By using UV Spectrometer, an UV-Vis absorption spectrum of the vanadium oxide thin film was measured at room temperature and is shown in FIG. 4 and FIG. 5. In the case of vanadium oxide having the same atomic percent as with Exemplary experiment 1, it can be seen to have absorption characteristics of the electromagnetic waves with a wavelength of 100 nm through 700 nm. Also, the wavelength of the electromagnetic wave for which the vanadium oxide thin film has the highest absorption coefficient can be seen to have a value between 100 nm and 700 nm.

Referring to FIG. 5, since the inflection point in the wavelength-absorption graph for the vanadium oxide thin film occurs at about 700 nm, the electromagnetic sensor using the vanadium oxide thin film can be seen capable of selectively sensing wavelengths below 700 nm. Hence, electromagnetic waves of the near infrared region can be excluded from the sensing region of the electromagnetic sensor.

Experimental Example 3

A silicon layer doped with an n-type or p-type dopant was formed on a board, and a vanadium oxide film was formed under the same conditions as in Exemplary experiment 1. Resistance of vanadium oxide thin film exposed to electromagnetic source with an intensity of 400 Lux and resistance of vanadium oxide thin film not exposed to the electromagnetic source were measured, respectively, and shown in the following Table 1.

TABLE 1

| Dopant type of doped silicon layer | Dopant concentration ($cm^{-3}$) | Resistance of vanadium oxide thin film under electromagnetic source of 400 Lux (MΩ) | Resistance of vanadium oxide thin film in state without electromagnetic source (MΩ) | Evaluation |
| --- | --- | --- | --- | --- |
| N | $1 \times 10^{16}$ | 0.9 | 5.00 | Large change |
| N | $1 \times 10^{17}$ | 0.79 | 2.63 | Large change |
| N | $1 \times 10^{18}$ | 0.65 | 1.86 | Large change |
| N | $1 \times 10^{19}$ | 0.15 | 0.15 | No change |
| P | $1 \times 10^{17}$ | 1.74 | 1.79 | Very small change |

Referring to Table 1, the vanadium oxide thin film on a silicon layer doped with an n-type dopant can be seen to sensitively react to electromagnetic waves compared with the vanadium oxide thin film on a silicon layer doped with a p-type dopant. Also, when the concentration of the n-type dopant is higher than $1.0 \times 10^{15}$ $cm^{-3}$ and lower than $1.0 \times 10^{19}$ $cm^{-3}$, a resistance change in the vanadium oxide thin film can be seen to be displayed.

Experimental Example 4

A silicon thin film doped with an n-type dopant at a concentration of about $1.0 \times 10^{18}$ $cm^{-3}$ was formed on a board. A vanadium oxide thin film was formed on the silicon thin film under the same conditions as in Exemplary experiment 1. Resistance of the vanadium oxide thin film was measured with illuminance being changed, and is shown in FIG. 6.

Referring to FIG. 6, the electromagnetic sensor according to exemplary embodiments of the present disclosure can be seen capable of sensing electromagnetic waves under the illuminance in the range of 0 Lux through 1000 Lux.

Experimental Example 5

A silicon layer doped with an n-type dopant was formed on a board, and a vanadium oxide thin film was formed on the silicon layer under the same conditions as in Exemplary experiment 1. Subsequently, mutually separated electrodes were formed on the vanadium oxide thin film to manufacture an electromagnetic sensor. Resistance between the electrodes was measured with temperature being changed.

White light was irradiated on the silicon layer and the vanadium oxide thin film, and resistance between the electrodes was measured again with temperature being changed.

Referring to FIG. 7, the electromagnetic sensor according to exemplary embodiments of the present disclosure can be seen capable of sensing temperature together. In the absence of white light, sensitivity to temperature can be seen to increase for the electromagnetic sensor according to exemplary embodiments of the present disclosure.

Experimental Example 6

A silicon layer doped with an n-type dopant was formed on a board, and a vanadium oxide thin film was formed on the silicon layer under the same conditions as in Exemplary experiment 1. Subsequently, mutually separated electrodes were formed on the vanadium oxide thin film to manufacture an electromagnetic sensor.

Absorption coefficient has been measured by using FTIR (Fourier Transform Infra-Red) equipment that produces and measures electromagnetic waves for a wavelength in the range of 2 μm through 25 μm, and the results are shown in FIG. 8.

Electromagnetic waves with a wavelength in the range of 2 μm through 25 μm belong to the mid-infrared region. The electromagnetic sensor according to exemplary embodiments of the present disclosure exhibits a small absorption peak near the human body region. Also, the electromagnetic sensor according to exemplary embodiments of the present disclosure exhibits an appearance wherein absorption coefficient continues to be increased up to 800 degrees. This means that the electromagnetic sensor according to exemplary embodiments of the present disclosure is capable of measuring not only human body temperatures but also temperatures up to 800 degrees. Therefore, the electromagnetic sensor according to exemplary embodiments of the present disclosure can be used as a sensor for sensing human body temperatures and as a thermistor.

Figure 9:
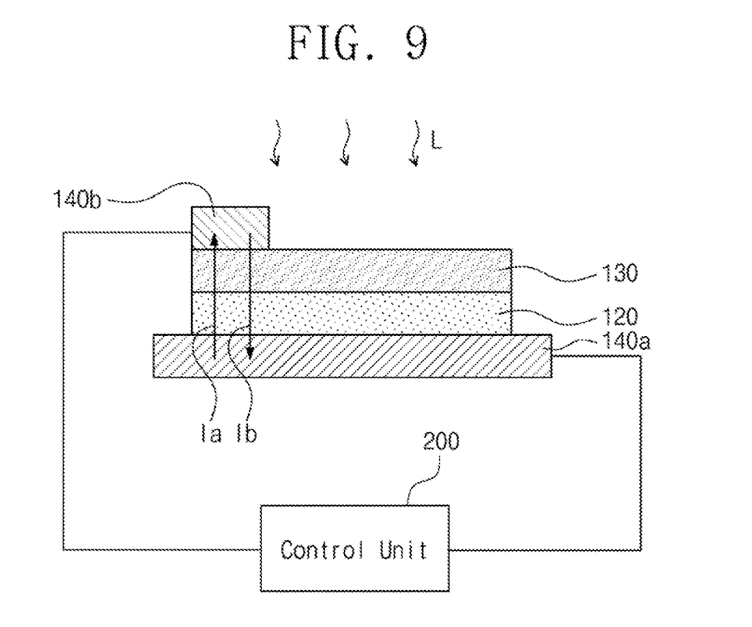
FIG. 9 is a block diagram roughly showing the electromagnetic sensor according to exemplary embodiments of the present disclosure.
Figure 10:
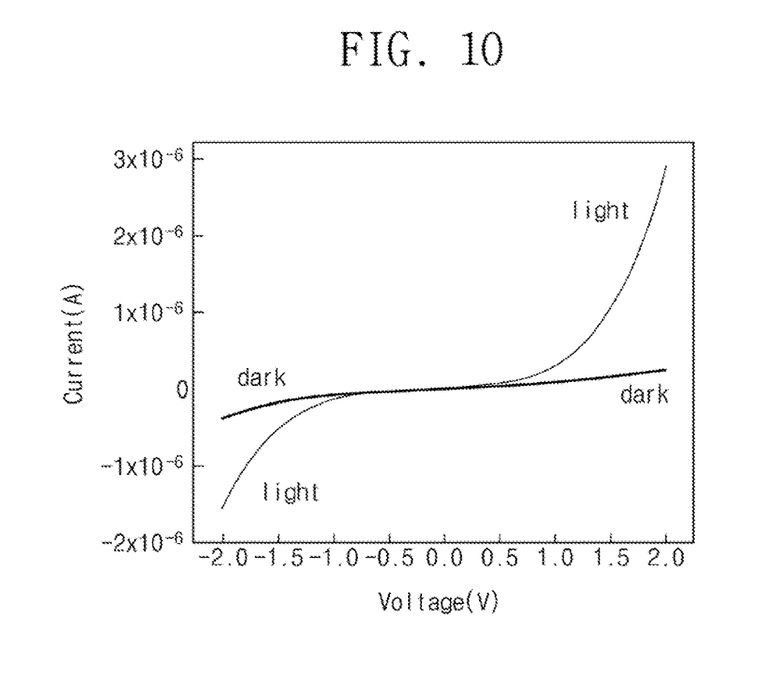
FIG. 10 is a graph showing electromagnetic sensing characteristics of the electromagnetic sensor as a function of direction of bias voltage.

FIG. 9 is a block diagram roughly showing the electromagnetic sensor according to exemplary embodiments of the present disclosure. FIG. 10 is a graph showing electromagnetic sensing characteristics of the electromagnetic sensor according to exemplary embodiments of the present disclosure described with reference to FIG. 9, and shows a change in sensing characteristics as a function of direction of bias voltage. For simplification of description, detailed descriptions on overlapped configuration may be omitted.

Referring to FIG. 9, the electromagnetic sensor according to exemplary embodiments of the present disclosure may comprise the first electrode (140a) connected to the first substance layer (120) and the second electrode (140b) connected to the second substance layer (130). The control unit (200) can be connected to the first electrode (140a) and the second electrode (140b). The control unit (200), the first electrode (140a), the first substance layer (120), the second substance layer (130) and the second electrode (140b) can form a closed circuit by being vertically arranged.

The control unit (200) can apply a bias voltage to the electromagnetic sensor in the first current direction (Ia) or the second current direction (Ib). Vanadium oxide within the second substance layer (130) can have holes as the majority carrier. When the first substance layer (120) is doped with an n-type dopant, the first substance layer (120) and the second substance layer (130) can function as a diode by forming a PN junction. According to one example, the first substance layer (120) and the second substance layer (130) can generate photovoltaic power in response to the received electromagnetic waves (L) and bias voltages (Ia, Ib). According to the present example, electromagnetic sensing signals outputted by the electromagnetic sensor can include photovoltaic power.

Experimental Example 5

A silicon thin film doped with a n-type dopant to the concentration of about. $1.0 \times 10^{18}$ cm$^{-3}$ was formed on a board. A vanadium oxide thin film was formed on the silicon thin film under the same conditions as in Exemplary experiment 1. Electrodes were formed respectively on the silicon thin film and the vanadium oxide thin film, and bias voltages were applied to the electrodes. Outputted current values were measured while magnitude and direction of the bias voltage were being changed, and the results are shown in FIG. 10.

Referring to FIG. 10, electromagnetic sensing characteristics can be seen changed as a function of direction of the bias voltage even if voltages of the same magnitude may be applied.

Figure 11:
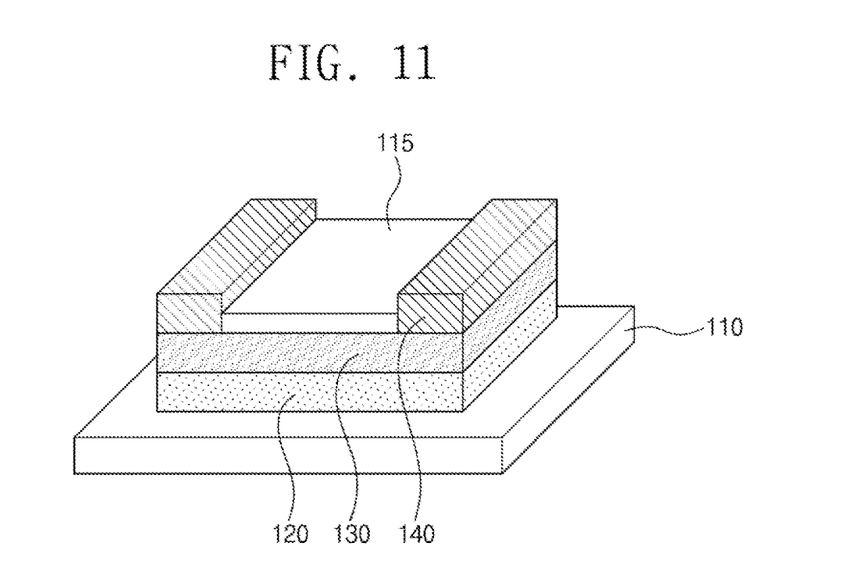
FIG. 11 is a perspective view of the electromagnetic sensor according to exemplary embodiments of the present disclosure.

FIG. 11 is a perspective view of the electromagnetic sensor according to exemplary embodiments of the present disclosure. For simplification of a description, detailed descriptions for the overlapped configuration may be omitted.

Referring to FIG. 11, the electromagnetic sensor may comprise a capping layer (115) covering the second substance layer (130). The capping layer (115) may comprise, for example, silicon oxide (SiO2), silicon nitride (SiN) or silicon oxynitride (SiON). The capping layer (115) can transmit electromagnetic waves of visible light region and ultraviolet ray region.

Figure 12:
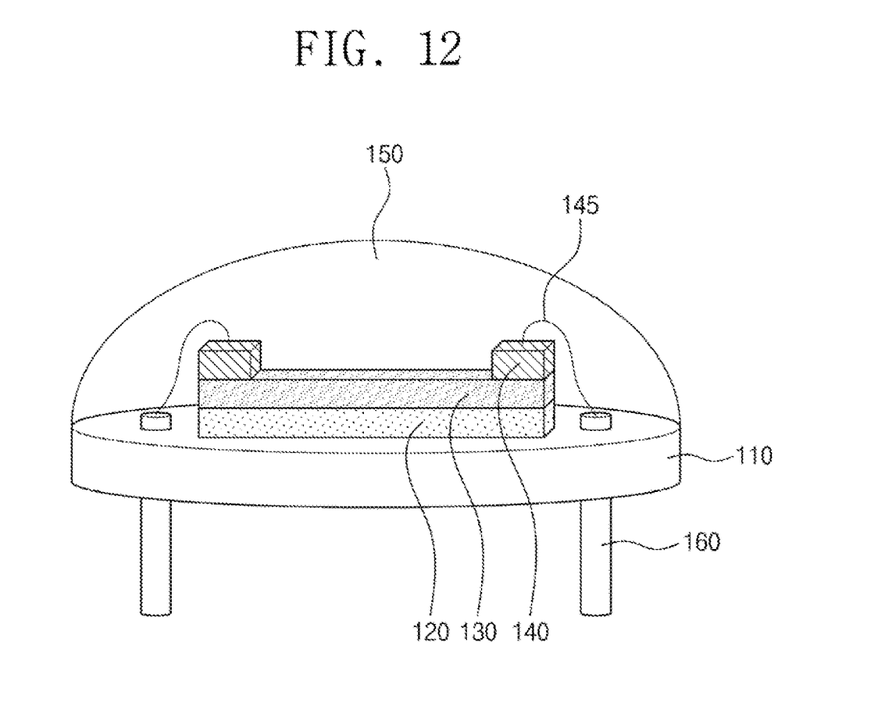
FIG. 12 is a perspective view of an electromagnetic sensor package according to exemplary embodiments of the present disclosure.

FIG. 12 is a perspective view showing an electromagnetic sensor package according to exemplary embodiments of the present disclosure. For simplification of a description, detailed descriptions for the overlapped configuration may be omitted.

Referring to FIG. 12, the electromagnetic sensor package may comprise; a support board (110), an electromagnetic sensor, wiring (145) terminals (160) and an encapsulation layer (150).

The support board (110) can have the shape of a circular flat plate. The support board (110) can include insulators.

The first substance layer (120) and the second substance layer (130) can be laminated on the support board (110). Two electrodes (140) can be arranged on the second substance layer (130) in mutual separation. The first substance layer (120), the second substance layer (130) and the electrode (140) can be the same as/similar to the description with reference to FIG. 1 through FIG. 9.

Terminals (160) can penetrate the support board (110) upward/downward. Upper part of the terminals (160) can be exposed to the upper face of the support board (110). Lower part of the terminals (160) can be exposed to beneath the lower face of the support board (110). When the sensor is mounted to the printed circuit board, the terminals (160) can include a pin connected to the printed circuit board (PCB, not shown).

Wiring (145) can connect the terminals (160) and the electrodes (140).

The encapsulation layer (150) can cover the support board (110), the electromagnetic sensor, the terminals (160) and the wiring (145). The encapsulation layer (150) can contain a transparent resin, for example. The encapsulation layer (150) can transmit electromagnetic waves of visible light region and ultraviolet ray region. The encapsulation layer (150) can have a semi-spherical shape so as to allow concentration of the electromagnetic waves incident on inside of the electromagnetic sensor package from outside of the electromagnetic sensor package.

Figure 13:
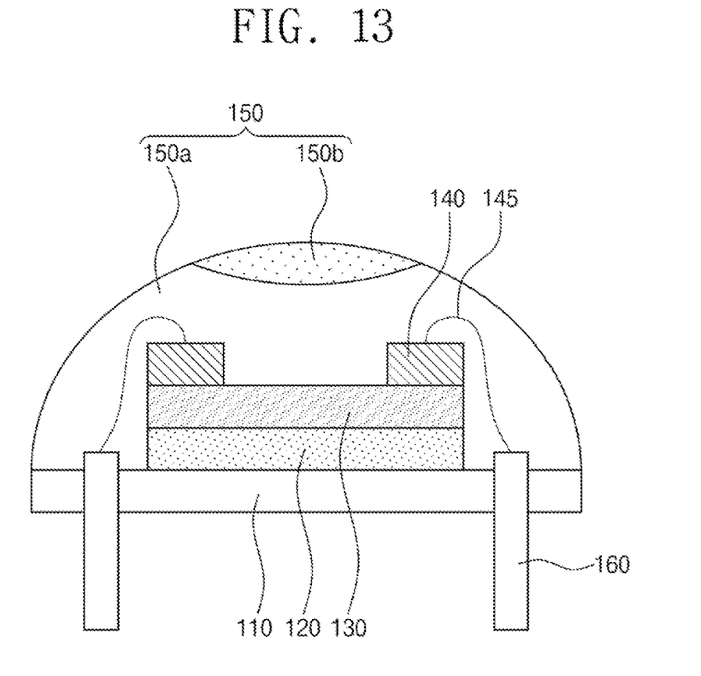
FIGS. 13 & 14 show perspective views of the electromagnetic sensor package according to exemplary embodiments of the present disclosure.

FIG. 13 is a perspective view showing the electromagnetic sensor package according to exemplary embodiments of the present disclosure. For simplification of a description, detailed descriptions for the overlapped configuration may be omitted.

Referring to FIG. 13, the encapsulation layer (150) may comprise the first layer (150a) and the second layer (150b) on the first layer (150a). The second layer (150b) may contain a material with a higher refractive index compared with the first layer (150a). The second layer (150b) can have the shape of a convex lens.

Figure 14:
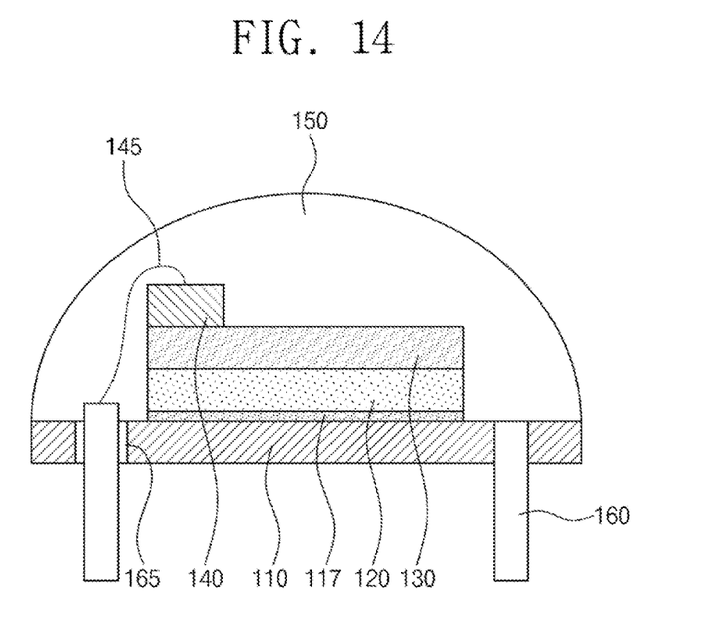

FIG. 14 is a cross sectional view showing the electromagnetic sensor package according to exemplary embodiments of the present disclosure. For simplification of a description, detailed descriptions for the overlapped configuration may be omitted.

Referring to FIG. 14, the electromagnetic sensor package can be a diode-type electromagnetic sensor package wherein the first substance layer (120) and the second substance layer (130) are connected in series.

Between the support board (110) and the first substance layer (120), conductive epoxy (117) can be arranged. At this time, the support board (110) may contain a conductive substance. The support board (110) may contain copper or aluminum, for example. The support board (110) can function as an electrode electrically connected to the first substance layer (120).

The first terminal (160a) can penetrate the support board (110). The first terminal (160a) can be electrically connected to the electrode (140) on the second substance layer (130) through the wiring (145). Insulating pattern (165) can be arranged between the first terminal (160a) and the support board (110). The first terminal (160a) and the support board (110) can be electrically separated by the insulating pattern (165). The second terminal (160b) can penetrate the support board (110). The second terminal (160b) can be electrically connected to the support board (110).

Figure 15:
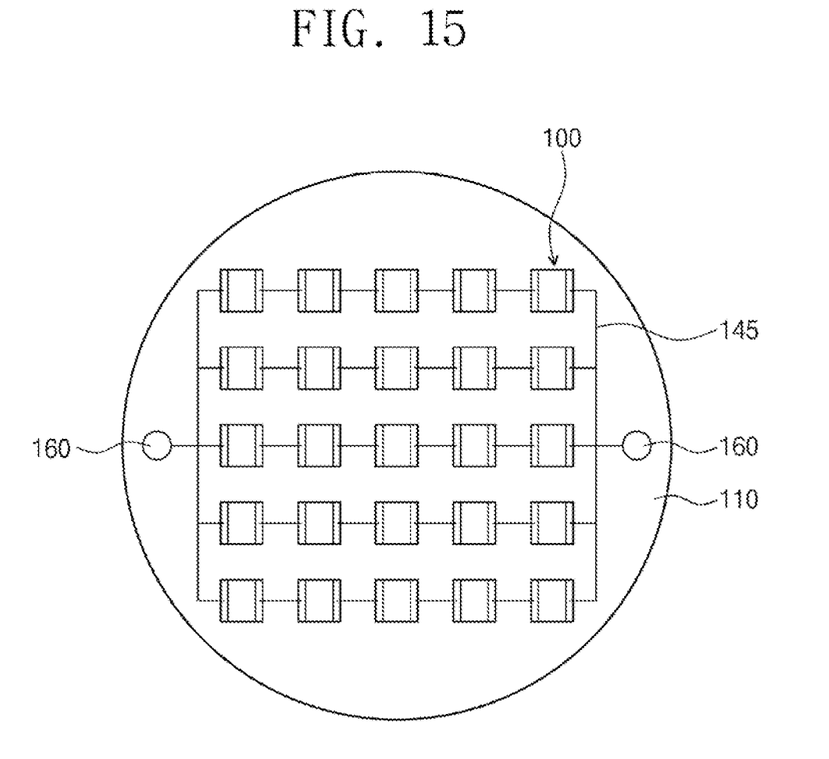
FIG. 15 is a plan view of the electromagnetic sensor package according to exemplary embodiments of the present disclosure.

FIG. 15 is a plan view showing the electromagnetic sensor package according to exemplary embodiments of the present disclosure. For simplification of a description, detailed descriptions for the overlapped configuration may be omitted.

Referring to FIG. 15, multiple electromagnetic sensors (10) can be arranged within one electromagnetic sensor package. Electromagnetic sensors (10) may comprise; the first substance layer (120), the second substance layer (130) on the first substance layer (120) and the electrodes (140) on the second substance layer (130), as shown diagrammatically in FIG. 2. The electromagnetic sensors (10) can be mutually connected in series or in parallel. The electromagnetic sensors (10) can be electronically connected to the terminals (160) penetrating the support board (110) through the wiring (145).

Figure 16:
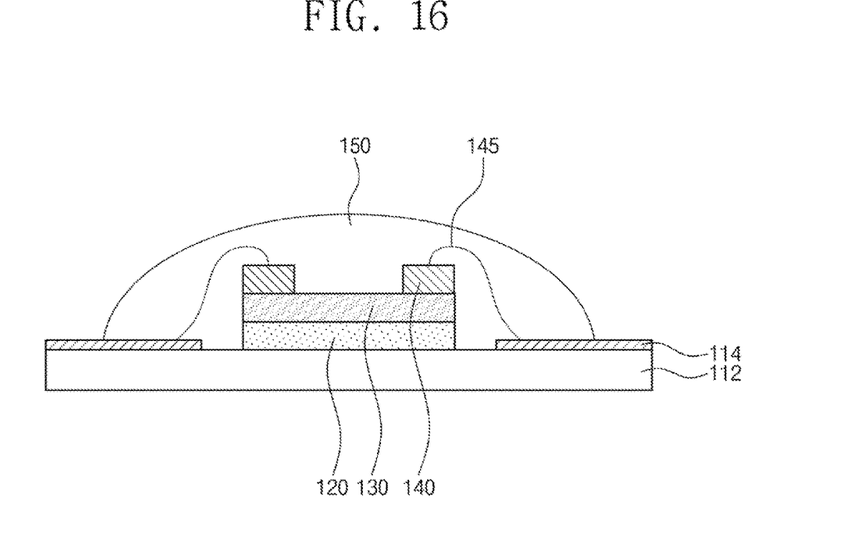
FIG. 16 is a cross sectional view of the electromagnetic sensor package according to exemplary embodiments of the present disclosure.

FIG. 16 is a cross sectional view of the electromagnetic sensor package according to exemplary embodiments of the present disclosure. For simplification of a description, detailed descriptions for the overlapped configuration may be omitted.

Referring to FIG. 16, the electromagnetic sensor package may comprise PCB (112) and the electromagnetic sensor mounted on the PCB (112). The PCB (112) may comprise conductive pads (114) exposed on the upper face of the same. The electrodes (140) of the electromagnetic sensor can be connected to the conductive pads (114) through the wiring (145).

Figure 17:
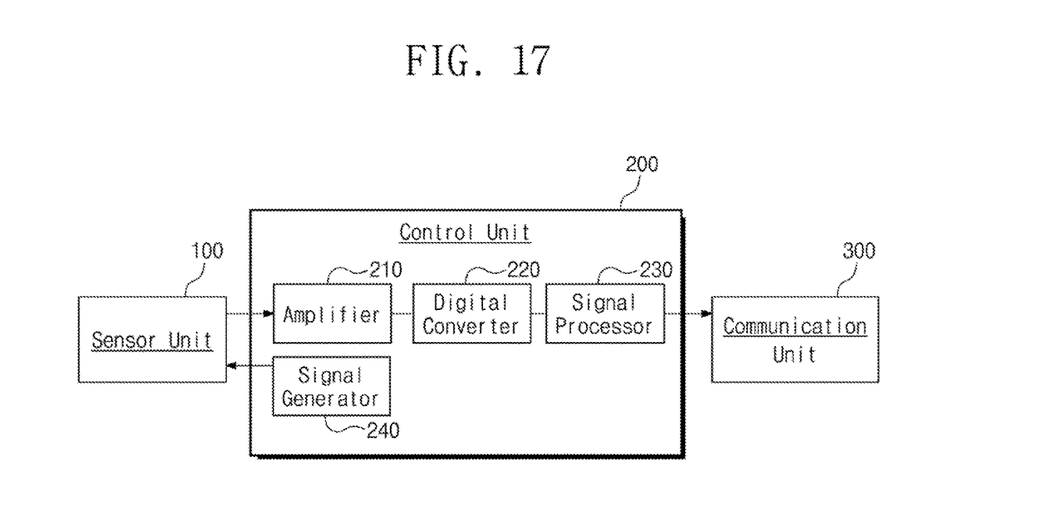
FIG. 17 is a block diagram showing the electromagnetic sensor system according to exemplary embodiments of the present disclosure.

FIG. 17 is a block diagram describing an electromagnetic sensor system according to exemplary embodiments of the present disclosure.

Referring to FIG. 17, the electromagnetic sensor system may comprise the sensor unit (100), the control unit (200) and the communication unit (300).

The sensor unit (100) may comprise the electromagnetic sensor (10) or the electromagnetic sensor package described with reference to FIG. 1 through FIG. 16. Namely, the sensor unit (100) may comprise the first and the second substance layers (120, 130) sequentially laminated as shown diagrammatically in FIG. 2. The sensor unit (100) can receive electromagnetic waves from outside of the electromagnetic sensor system. The sensor unit (100) can output the sensing signals to the control unit (200) after absorbing electromagnetic waves in the wavelength region of 100 nm through 700 nm among the received electromagnetic waves.

The control unit (200) may comprise a signal generator (240), an amplifier (210), a digital converter (220) and a signal processor (230). The signal generator (240) can input control signals in the sensor unit (100). The control signals can include bias voltage, for example. The sensor unit (100) can generate sensing signals responding to the control signals and the absorbed electromagnetic waves and output to the amplifier (210). The amplifier (210) can amplify the sensing signals and transmit the same to the digital converter (220). The digital converter (220) can have the processor convert the amplified sensing signals transmitted from the amplifier (210) to processable digital signals and output the same to the signal processor (230). The signal processor (230) can sort and process the digital signals received from the digital converter (220) and generate electromagnetic sensing data. The signal processor (230) can provide the communication unit (300) with electromagnetic sensing data.

The communication unit (300) may comprise wired or wireless communication means. The communication unit (300) can output the electromagnetic sensing data received from the control unit (200) by wired or wireless means.

Figure 18:
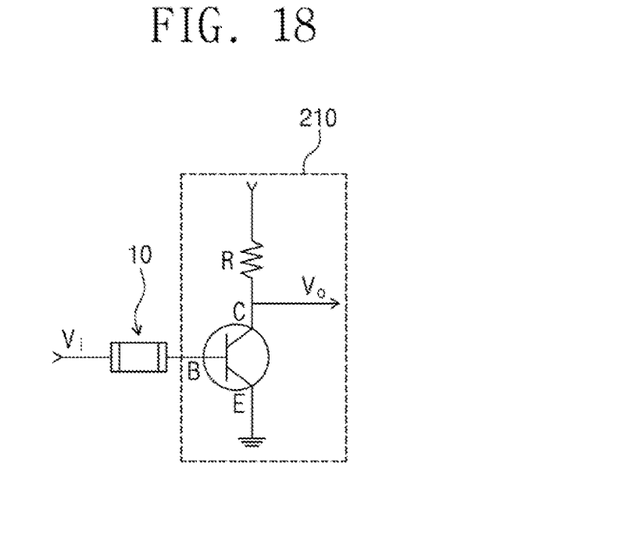
FIGS. 18 & 19 are circuit diagrams of an electromagnetic sensor amplifier system showing the electromagnetic sensor and the amplifier, respectively, according to exemplary embodiments of the present disclosure.
Figure 19:
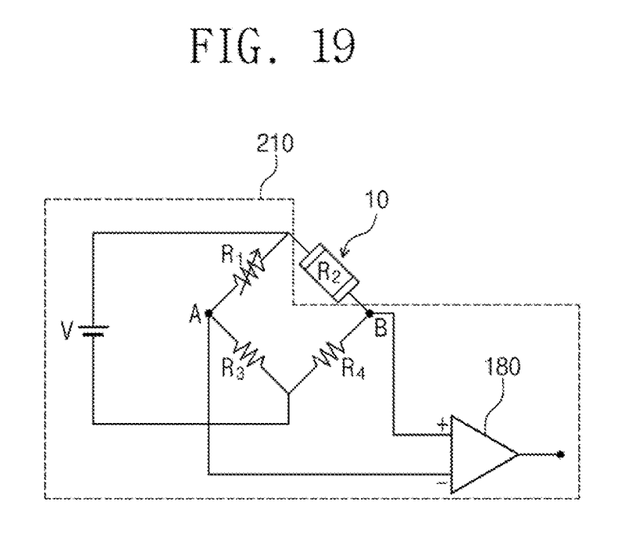

FIGS. 18 and 19 are circuit diagrams showing the electromagnetic sensor and the amplifier, respectively, according to exemplary embodiments of the present disclosure.

Referring to FIG. 18, the amplifier (210) may comprise transistors having base, collector and emitter. The electromagnetic sensor (10) according to exemplary embodiments of the present disclosure can be connected to the transistor's base. According to the exemplary embodiments, the amplifier (210) may comprise field effect transistors.

Referring to FIG. 19, the amplifier (210) may comprise Wheatstone bridge measuring resistance values of the first and the second substance layers (120, 130) and a differential amplifier to amplify output voltages of Wheatstone bridge. Wheatstone bridge can amplify very small sensing signals. Specifically, the resistance can be made 0 by adjusting potential differences between the first spot (A) and the second spot (B) with variable resistance (R1). Subsequently, a potential difference is produced between spot A and spot B when resistance (R2) of the electromagnetic sensor is changed, and the potential difference can be amplified by the differential amplifier (180).

Figure 20:
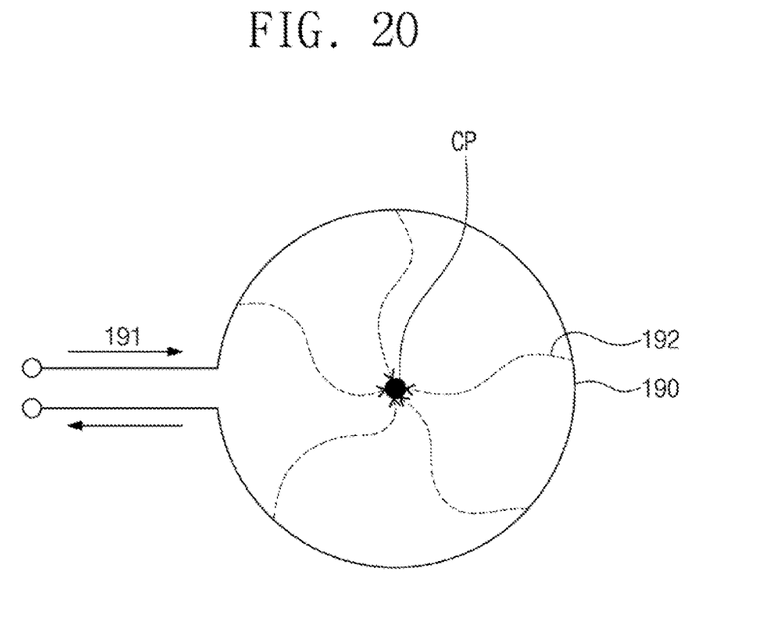
FIG. 20 is a drawing showing an electromagnetic measurement method using the electromagnetic sensor, according to exemplary embodiments of the present disclosure.
Figure 21:
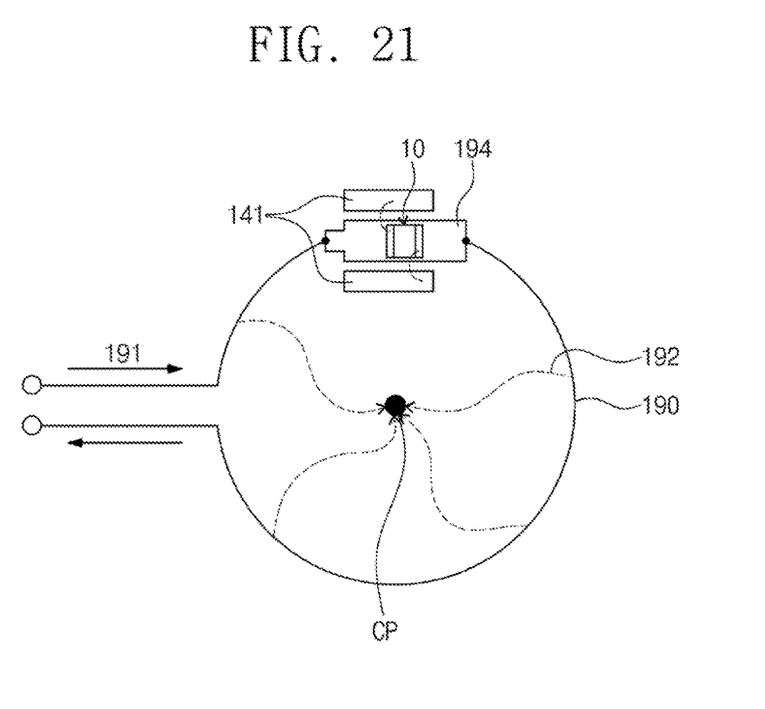
FIG. 21 is a drawing showing a method for current measurement using the electromagnetic sensor, according to exemplary embodiments of the present disclosure.

FIG. 20 is a drawing showing a measurement method of electromagnetic waves by using the electromagnetic sensor, according to exemplary embodiments of the present disclosure. FIG. 21 is a drawing showing a current measuring method by using the electromagnetic sensor, according to exemplary embodiments of the present disclosure.

Referring to FIG. 20, the electromagnetic sensor (10) according to exemplary embodiments of the present disclosure can measure thermal infrared ray produced by heat generation in magnetic field and leading wire (190). Specifically, the leading wire (190) can have the shape of a part of circle. When current (191) flows through the leading wire (190), thermal infrared ray and magnetic field (192) can be concentrated in the center part (CP) defined by the leading wire (190). When the electromagnetic sensor (10, See FIG. 2) is arranged in the center part (CP), the electromagnetic sensor (10) can measure thermal infrared ray and magnetic field (192).

Referring to FIG. 21, the leading wire (190) can have the shape of a part of circle, and a metal plate (194) can be arranged between the leading wires (190). The metal plate (194) can connect the leading wire (190). Namely, current (191) can flow through the metal plate (194). When the electromagnetic sensor (10) is arranged on the metal plate, the electromagnetic sensor (10) can measure thermal magnetic force lines produced by the current (191) flowing through the metal plate (194). Therefore, the electromagnetic sensor according to exemplary embodiments according to the present disclosure can also be used as a current sensor. The electromagnetic sensor (10) may further comprise outside electrodes (141) electrically connected to the electrodes.

According to exemplary embodiments of the present disclosure, sensitivity to electromagnetic waves of thermal infrared ray, visible light, and ultraviolet ray regions can be improved, and an electromagnetic sensor of an oxygen-rich vanadium oxide not affected by electromagnetic wave in ultraviolet ray region can be provided.

While exemplary embodiments of the present disclosure have been described above with reference to the attached drawings, the present invention may be embodied in other specific forms without changing technical ideas or essential features of the same. Therefore, the exemplary embodiments described above are illustrative in all aspects, and should be understood as not being restrictive.

What is claimed is:

1. An electromagnetic sensor which comprises;
   the first substance layer containing silicon doped with an n-type dopant; and
   the second substance layer installed on the first substance layer and containing a vanadium oxide represented by molecular formula of VxOy; and
   the first electrode on the second substance layer; and
   the second electrode on the first substance layer or the second substance layer,
   with dopant concentration for the first substance layer being higher than $1.0 \times 10^{15}$ cm$^{-3}$ and lower than $1.0 \times 10^{19}$ cm$^{-3}$; and
   with the ratio of y to x in the molecular formula being larger than 2 and smaller than 2.5.

2. The electromagnetic sensor of claim 1, the electromagnetic sensor wherein the second electrode is arranged on the second substance layer, and separated from the first electrode.

3. The electromagnetic sensor of claim 1, the electromagnetic sensor wherein the second electrode is arranged on the first substance layer.

4. The electromagnetic sensor of claim 1, the electromagnetic sensor wherein the first wavelength has a value between 100 nm and 700 nm while the second substance layer has the highest absorption coefficient for the electromagnetic wave of the first wavelength.

5. The electromagnetic sensor of claim 1, the electromagnetic sensor has an absorption coefficient for the electromagnetic waves between 2 μm and 20 μm.

6. An electromagnetic sensor amplifier system which comprises;
   the sequentially laminated first and the second substance layers; and
   electrodes on the first and the second substance layers; and
   an amplifier for amplifying sensing signals received from the first and the second substance layers by being connected to the electrodes,
   wherein the first substance layer contains silicon doped with an n-type dopant with a dopant concentration in the first substance layer being higher than $1.0 \times 10^{15}$ cm$^{-3}$ and lower than $1.0 \times 10^{19}$ cm$^{-3}$; and
   the second substance layer contains a vanadium oxide represented by the molecular formula of VxOy with the ratio of y to x in the molecular formula being larger than 2 and smaller than 2.5.

7. The electromagnetic sensor system of claim 6, the electromagnetic sensor system comprising a digital converter for converting the amplified sensing signals received from the amplifier to the digital signals.

8. The electromagnetic sensor system of claim 6, the electromagnetic sensor amplifier system wherein the amplifier comprises Wheatstone bridge for measuring resistance values of the first and the second substance layers, and a differential amplifier for amplification of output voltage from the Wheatstone bridge.

* * * * *